United States Patent
Balan

(10) Patent No.: US 9,529,280 B2
(45) Date of Patent: Dec. 27, 2016

(54) STAGE APPARATUS FOR SEMICONDUCTOR INSPECTION AND LITHOGRAPHY SYSTEMS

(71) Applicant: KLA-Tencor Corporation, Milpitas, CA (US)

(72) Inventor: Aviv Balan, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/559,398

(22) Filed: Dec. 3, 2014

(65) Prior Publication Data

US 2015/0160564 A1 Jun. 11, 2015

Related U.S. Application Data

(60) Provisional application No. 61/913,169, filed on Dec. 6, 2013.

(51) Int. Cl.
*G03B 27/58* (2006.01)
*G03B 27/42* (2006.01)
*G03F 7/20* (2006.01)

(52) U.S. Cl.
CPC .................. *G03F 7/70775* (2013.01)

(58) Field of Classification Search
CPC .............................. G03F 7/707; G03F 7/70775
USPC .................. 355/53, 55, 67; 356/399–401
See application file for complete search history.

(56) References Cited

U.S. PATENT DOCUMENTS

| 6,509,969 | B1 | 1/2003 | Takeshita et al. |
| 6,686,991 | B1 | 2/2004 | Binnard et al. |
| 6,819,425 | B2 | 11/2004 | Kwan |
| 6,970,255 | B1 | 11/2005 | Spady et al. |

(Continued)

FOREIGN PATENT DOCUMENTS

| EP | 1646912 B1 | 9/2009 |
| JP | 2004101362 | 4/2004 |

(Continued)

OTHER PUBLICATIONS

"Self-Compensating Absolute Laserscale", Magnescale, Oct. 20, 2014, Retrieved from the Internet: <http://www.mgscale.com/mgs/language/english/news/20141020-1.html>, 3 pgs.

(Continued)

*Primary Examiner* — Hung Henry Nguyen
(74) *Attorney, Agent, or Firm* — Kwan & Olynick LLP

(57) ABSTRACT

A semiconductor sample is received on a chuck of a stage that is movable with respect to a stage frame. The stage, chuck, and sample are moved under an inspection or exposure head for inspecting or exposing the sample, and multiple 2D encoder heads are coupled with the chuck. Multiple 2D encoder scales are coupled with a base through which the head is inserted, and a stage encoder is positioned on the stage frame. Movement of the stage, chuck, and sample is controlled based on a position detected by at least one of the 2D encoder heads until a predefined position that is within a gap that is not covered by the 2D encoder scales is reached. Movement control of the stage, chuck, and sample is switched to being based on a position detected by the stage encoder when such predefined position that is within the gap is reached.

19 Claims, 10 Drawing Sheets

(56) References Cited

U.S. PATENT DOCUMENTS

| | | | |
|---|---|---|---|
| 7,289,212 B2* | 10/2007 | Kwan | G03F 7/70716 355/53 |
| 7,812,964 B2 | 10/2010 | Hill | |
| 8,786,829 B2* | 7/2014 | Kanaya | G03F 7/70341 355/30 |
| 2009/0190110 A1* | 7/2009 | Shibazaki | G03F 7/70775 355/53 |
| 2010/0227263 A1* | 9/2010 | Sato | G03B 27/58 430/30 |
| 2010/0321665 A1 | 12/2010 | Hardeman | |
| 2013/0114062 A1 | 5/2013 | Liesener | |

FOREIGN PATENT DOCUMENTS

| | | |
|---|---|---|
| KR | 20130055023 A | 5/2013 |
| WO | 0017724 A1 | 3/2000 |
| WO | 2012122027 A2 | 9/2012 |
| WO | 2013100202 A1 | 7/2013 |
| WO | 2013113633 A1 | 8/2013 |

OTHER PUBLICATIONS

International Application Serial No. PCT/US2014/068921, Search Report mailed Mar. 19, 2015, 4 pgs.

\* cited by examiner

STAGE APPARATUS FOR SEMICONDUCTOR INSPECTION AND LITHOGRAPHY SYSTEMS

CROSS-REFERENCE TO RELATED APPLICATION

This application claims priority to U.S. Provisional Patent Application No. 61/913,169, filed 6 Dec. 2013, which application is incorporated herein by reference in its entirety for all purposes.

TECHNICAL FIELD OF THE INVENTION

The invention generally relates to the field of semiconductor inspection and lithography systems. More particularly the present invention relates to stage mechanisms for such inspection and lithography systems.

BACKGROUND

Generally, the industry of semiconductor manufacturing involves highly complex techniques for fabricating integrating circuits using semiconductor materials that are layered and patterned onto a substrate, such as silicon. An integrated circuit is typically fabricated from a plurality of reticles. Generation of reticles and subsequent optical inspection of such reticles have become standard steps in the production of semiconductors. The fabrication of semiconductor devices, such as logic and memory devices, typically includes processing a semiconductor wafer using a large number of semiconductor fabrication processes with multiple reticles to form various features and multiple levels of the semiconductor devices. Multiple semiconductor devices may be fabricated in an arrangement on a single semiconductor wafer and then separated into individual semiconductor devices. The wafer position with respect to the reticle is a significant factor that affects fabrication results.

After wafer is fabricated, it may be inspected for defects or certain features of the wafer may be measured. Likewise, reticles may be inspected and reticle features measured. One factor is the ability to accurately report a defect's or measurement location.

Lithography and inspection systems both have a need for accurate positioning and position detection systems.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

An apparatus for fabricating, measuring, or inspecting a semiconductor wafer is disclosed. The apparatus includes an inspection or exposure head for inspecting or exposing a sample in the form of a semiconductor wafer or photolithography mask and a base having a hole through which the head is inserted. The apparatus also includes a movable stage having a chuck for holding the sample, and the apparatus includes a stage controller (e.g., servo controller) for controlling movement of the chuck and sample with respect to the head. The apparatus includes multiple two dimensional (2D) encoder scales that are affixed to a surface of the base that is opposite a surface of the chuck, and the 2D encoder scales are arranged to form a gap around the hole of the base through which the head is inserted. The apparatus also includes multiple chuck encoder heads affixed to the chuck for detecting a position of the stage and sample relative to the head via the 2D encoder scales. The apparatus also has a stage encoder for detecting a position of the chuck and sample. The stage controller is configured to control movement of the movable stage and chuck based on either (i) the position detected from the chuck encoder heads when such chuck encoder heads are not transitioning across the gap between the 2D encoder scales or (ii) the position detected from the stage encoder when the chuck encoder heads are transitioning across such gap. The apparatus may also include a defect detector for detecting defects on the sample and reporting a position of such defects based on either (i) the position detected from the chuck encoder heads when such chuck encoder heads are not transitioning across the gap or (ii) the position detected from the stage encoder when the chuck encoder heads are transitioning across the gap.

By way of specific examples, the 2D encoder scales may number 2 or 4. The stage encoder may be in the form of two linear stage encoders from which an X,Y position is detected. The two linear stage encoders may each include an encoder head that is integrated with the stage controller and an encoder scale that is coupled with a stage frame that is stationary with respect to the movable stage.

The apparatus may be in the form of a semiconductor photolithography, inspection, or metrology tool. The head may be an optical column for directing one or more optical beams towards the sample or an electron beam column for directing one or more electron beam towards the sample.

In an alternative embodiment, the stage controller is instead configured to control movement of the movable stage and chuck based on the position detected from the stage encoder, while the defect detector determines and reports defect positions based on the position detected from the chuck encoder heads. In this alternative embodiment, determining and reporting of the defect positions may also be based on the position detected from the chuck encoder heads only when such chuck encoder heads are not transitioning across the gap. Otherwise, determining and reporting of the defect positions is based on the position detected from the stage encoder when the chuck encoder heads are transitioning across the gap.

In another embodiment, the invention pertains to a method. A semiconductor sample is received on a chuck of a stage that is movable with respect to a stage frame. The stage, chuck, and sample are moved under an inspection or exposure head for inspecting or exposing the sample, and multiple 2D encoder heads are coupled with the chuck. Multiple 2D encoder scales are coupled with a base through which the head is inserted, and a stage encoder is positioned on the stage frame. Movement of the stage, chuck, and sample is controlled based on a position detected by at least one of the 2D encoder heads until a predefined position that is within a gap that is not covered by the 2D encoder scales is reached. Movement control of the stage, chuck, and sample is switched to being based on a position detected by the stage encoder when such predefined position that is within the gap is reached.

In this method embodiment, the sample may be inspected for defects using an inspection head, which is in the form of an inspection head. Defect locations may also be determined and reported based on a position detected by at least one of the 2D encoder heads until the predefined position that is within a gap not covered by the 2D encoder scales is reached. The defect location determination and reporting may be switched to being based on a position detected by the stage encoder when the predefined position is reached. Both the controlling of movement and defect determination and reporting may be switched back from being based on a position detected by the stage encoder to at least one of the 2D encoder heads when a second predefined position that is not within the gap is reached. In another embodiment, movement control is based on a position detected by the stage encoder, while only defect location determination and reporting are switched between being based on a position detected from the stage encoder and 2D encoder heads.

These and other aspects of the invention are described further below with reference to the figures.

DETAILED DESCRIPTION OF EXAMPLE EMBODIMENTS

Figure 1:
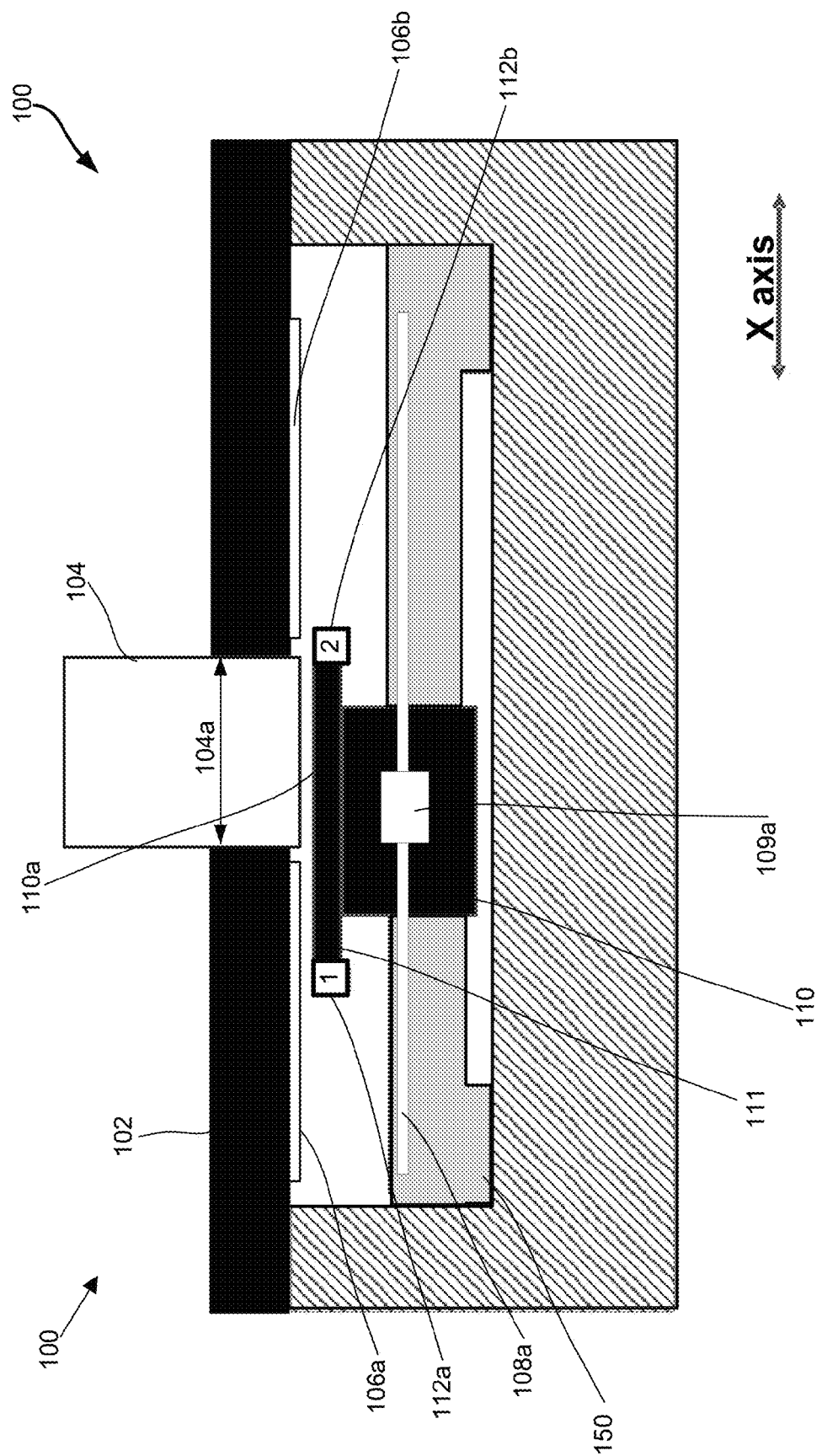
FIG. 1 is a diagrammatic side view representation of a stage position detection system in accordance with one embodiment of the present invention.

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

An integrated circuit wafer with multiple device dies is typically fabricated from a plurality of reticles having multiple device dies. Generation of reticles and subsequent optical inspection of such reticles have become standard steps in the production of semiconductors. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout includes a representational layer for each physical layer of the IC device (e.g., gate oxide, polysilicon, metallization, etc.), wherein each representational layer is composed of a plurality of polygons that define a layer's patterning of the particular IC device.

The reticle writer uses the circuit pattern data to write (e.g., typically, an electron beam writer or laser scanner is used to expose a reticle pattern) a plurality of reticles that will later be used to fabricate the particular IC design. A reticle or photomask is an optical element containing at least transparent and opaque regions, and sometimes semi-transparent and phase shifting regions, which together define the pattern of coplanar features in an electronic device such as an integrated circuit.

After fabrication of each reticle or group of reticles, each reticle is typically inspected for defects by illuminating it with light emanating from a controlled illuminator. A test image of a portion of the reticle is constructed based on the portion of the light reflected, transmitted, or otherwise directed to a light sensor. Such inspection techniques and apparatus are well known in the art and are embodied in various commercial products such as many of those available from KLA-Tencor Corporation of Milpitas, Calif.

In one conventional inspection process, the test image of the reticle is typically compared to a baseline image. Typically, the baseline image is either generated from the circuit pattern data or from an adjacent die on the reticle itself Either way, the test image features are analyzed and compared with features of the baseline image. Each difference value is then compared with a predetermined threshold value. If the test image varies from the baseline image by more than the predetermined threshold, a defect and its location are defined and reported. Other types of inspection modes, such as scatterometry, may also be utilized to inspect or measure characteristics of a sample.

If the set of reticles are determined to be defect free, they can then be used to fabricate patterns on a semiconductor wafer. Reticles are used during photolithography to define specified regions of a semiconductor wafer for etching, ion implantation, or other fabrication process. The fabrication of semiconductor devices, such as logic and memory devices, typically includes processing a semiconductor wafer using a large number of semiconductor fabrication processes with multiple reticles to form various features and multiple levels of the semiconductor devices. Multiple semiconductor devices may be fabricated in an arrangement on a single semiconductor wafer and then separated into individual semiconductor devices.

High position accuracy is one important factor for wafer inspection and lithography tools. The future requirements for stage accuracy is predicted to be in the region of a few nanometers. For instance, an inspection tool may need to report the defect location within a few nanometer when defining very small care areas and reporting the defect location with respect to the wafer design files so that defects can be further analyzed. Likewise, position resolution in photolithography tools is also increasing.

Figure 2:
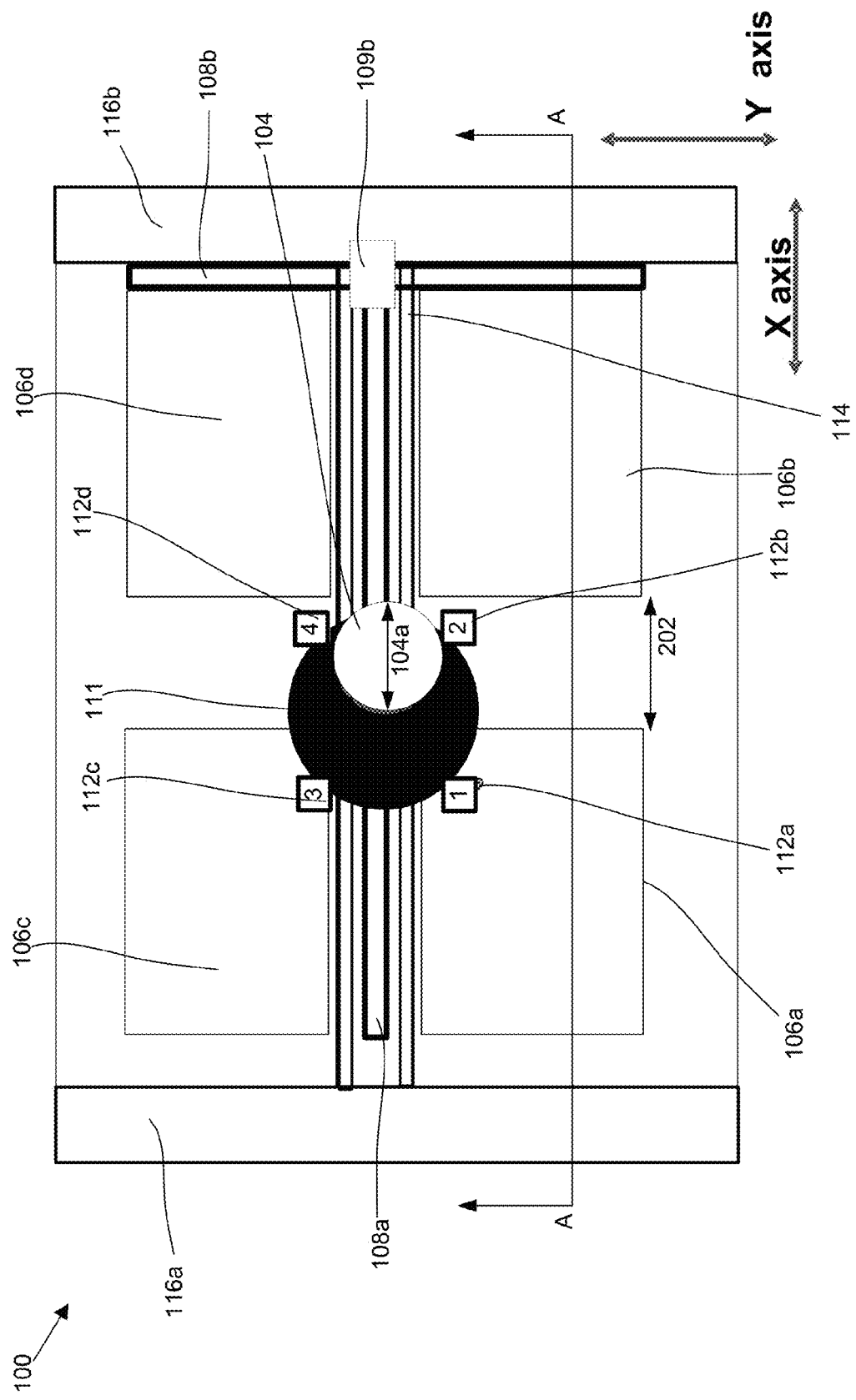
FIG. 2 is a diagrammatic top view of the stage position detection system of FIG. 1.

Certain embodiments of the present invention can provide nanometer positioning accuracy image alignment using relatively standard optical X,Y grid encoder systems. FIG. 1 is a diagrammatic side view representation of a stage position detection system 100 in accordance with one embodiment of the present invention. FIG. 2 is a diagrammatic top view of the stage position detection system 100. Additionally, FIG. 1 is a side view from line A-A of FIG. 2. The position detection system of FIGS. 1 and 2 represent one possible embodiment, and it is understood that other arrangements are contemplated.

Additionally, certain position detection embodiments of the present invention may be implemented in any suitable exposure, metrology, or inspection tool that requires precision position detection. Such tool may include any suitable number and type of heads (or inspection or exposure system) for directing one or more electromagnetic beams towards a sample. By way of examples, the head may take the form of an optics column, electron-beam column, x-ray beam column, etc. Although the term "optics" head is used herein to describe any type of head for generating one or more electromagnetic beams.

As shown, an optics head 104 is secured to a base 102. In one implementation, the optics base 102 has a hole through which the optics head 104 is fixably inserted. A stage 110 includes a chuck 111 to receive or hold a sample. The stage 110 and chuck 111 move the sample under the optics head 104.

As shown in FIG. 1, two or more-dimensional (2D) encoder scales (e.g., 106*a* and 106*b*) are affixed to optics base 102, e.g., through which the optics head is inserted. In an alternative embodiment, multiple linear encoder scales may be attached to the optics base 102. Two or more chuck encoder heads (e.g., 112*a* and 112*b*) are affixed to the stage 110 to detect the 2D encoder scales (e.g., 106*a* and 106*b*). The detected position relative to the 2D encoder scales gives a precise position of the stage (and chuck and sample) with respect to the optics head 104.

The grid encoders (or 2D encoder scales) may be affixed to a surface of the optics base 102 that is opposite the sample surface or stage surface onto which the sample is placed. By way of example, the base 102 may be formed from a granite material onto which any clamping mechanism may be attached for clamping grid encoder scales (e.g., grid encoder glass) thereon. In another example, an adhesive, such as double sided adhesive, may be used to attach each grid encoder to the base 102.

The encoder heads move with the stage 110, chuck 111, and sample relative to the 2D encoder scales that are positioned to be static with the optics base 102 and optics head 104. This relative arrangement is configured so that the one or more encoder heads can detect positions on the one or more 2D encoder grids and determine a position of the sample relative to the optics 104. Each encoder head is generally a sensor, transducer, or reading-head that can read a 2D encoder scale that encodes position. Each encoder head coverts the sensed scale position into an analog or digital signal, which can be decoded into a position value by a digital readout (DRO) mechanism or motion controller mechanism. Velocity can be determined by changes of position with time. The encoder scale positions can be either incremental or absolute.

The encoder scale can be implemented by any suitable technology, such as optical, inductive, capacitive, or eddy current. Optical encoders include shadow, self-imaging, interferometric, or hologram scale with high diffraction efficiency based on grating interference methods.

The hole through the optics base 102 may have a diameter that is larger than or the same as a diameter of the optics column 104. As shown, the optics base 102 and optics column 104 have a same diameter 104*a* so that the optics is snuggly fitted into the hole in the base. The size of the hole in the optics base limits the placement and size of the one or more grid encoders. If the size of the hole is small, it is possible to use a single grid encoder and encoder head on the chuck to track all positions. That is, if the footprint of the gap is not an issue and the chuck can be made big and the grid encoder bigger than the wafer, the sensor can always stay within one grid area. Usually, this set up is not the case, and the foot print is an issue. In this latter case, two (or more) grid encoders may be used, with a grid encoder on each side of the head.

If the uncovered area is large or a single encoder grid cannot cover all the travel positions of the chuck, multiple encoder grids can be used. A plurality of encoders can be placed on the underside of the optics base in any suitable arrangement so as to cover all the possible positions of the chuck 111 and sample. In one embodiment, a plurality of encoder grids are placed around the hole in the optics base.

FIG. 2 illustrates a top view of a four piece encoder arrangement to cover full travel of the chuck and stage. As shown, the chuck travel area can be covered by four encoder grids 106*a*~106*d*, which are attached to the underside of the optics base. In one embodiment, the encoder grids each include 2D scales, for example, in both an X and Y direction. The encoder grids are preferably formed on materials that are temperature stable, such as glass, Zerodure available from Schott North America Inc. of Elsford, N.Y. or Neoceram available from One Day Glass of Vancouver, Wash.

The system 100 can also include one or more stage encoders that are positioned along an x and/or y axis. In the illustrated embodiment of FIGS. 1 and 2, respectively, an x axis linear encoder scale 108*a* is paired with stage encoder head 109*a* and the y axis linear encoder scale 108*b* is paired with stage encoder head 109*b*. The stage encoder heads and scales may be positioned in any suitable manner. For example, a stage encoder head can be located above its corresponding encoder scale. Alternatively, a stage encoder head and scale pair can be both positioned at a similar z position. For instance, the y axis encoder head and scale can be located at different x axis positions, but at a same z position. A stage encoder head and scale can also be located underneath the chuck or to a side of the chuck. By way of example, the stage encoder scales can be coupled or affixed with the stage frame (e.g., 150).

The stage encoder heads 109*a* and 109*b* may each also be integrated with a stage controller, such as a servo controller and amplifier. The servo controller may be implemented in any suitable manner, such as a custom field programmable gate array (FPGA) or digital signal processor (DSP) that is configured to provide position correction and servo control. Alternatively, the stage encoder heads and stage controllers may be physically separated components that are communicatively coupled with each other.

The system 100 may also include any number and type of stage controllers for moving the stage and chuck, for example, in both an X and Y direction. As shown in FIG. 2, the stage 110 is attached and movable along rails 114 for the x axis and rails 116*a* and 116*b* for the Y axis via one or more servo controllers (109*a* and 109*b* of FIGS. 1 and 2, respectively). A stage movement mechanism may be formed from a servomotor, stepper motor, linear motor drive with air bearing or magnetic levitation or rails guide, by way of examples. In this example, the rails 114 for the x axis move together to different y positions along the y rails. Although the y axis linear encoder 108*b* is shown separate from the y rails 116, the y axis linear encoder 108b may be coupled to one of these rails 116a or 116b.

Some conventional inspection tools utilize only non-contact linear encoders for stage position sensing and defect location reporting. A linear encoder is typically located away from the wafer chuck and, accordingly, cannot read the actual chuck position due to Abbe error and drift. Other conventional position sensors include laser interferometers that are subject to various problems, such as laser drift and air wiggle.

In contrast, 2D encoders that rely on using X,Y position information from sensors mounted to the substrate chuck can be used to remove Abbe and thermal errors that would normally limit the accuracy of the system. Abbe error generally occurs when the feedback for stage position has a discrepancy with respect to the actual sample position, e.g., if a feedback encoder is not positioned well on the stage substrate. The stage parts may also contract or expand under different temperatures or over time, causing linear encoders that are positioned thereon to also move. In contrast, a 2D grid encoder that is statically placed with respect to the optics head 104 will report the real stage position relative to the inspection optical head or lithography printing head without reliance on stage encoder information. Since the 2D grid encoders 106 are placed on the optics base 102, which is a relatively flat static surface and is fixably attached to the optics head 104, the 2D grid encoders 106 that are sensed by the chuck encoder heads 112 will likely not result in different relative positions with respect to the optics head 104. In one embodiment, the distance between the chuck encoder heads and the optics base (and 2D grid encoders 106) is equal to or less than about 2 mm.

Figure 3A:
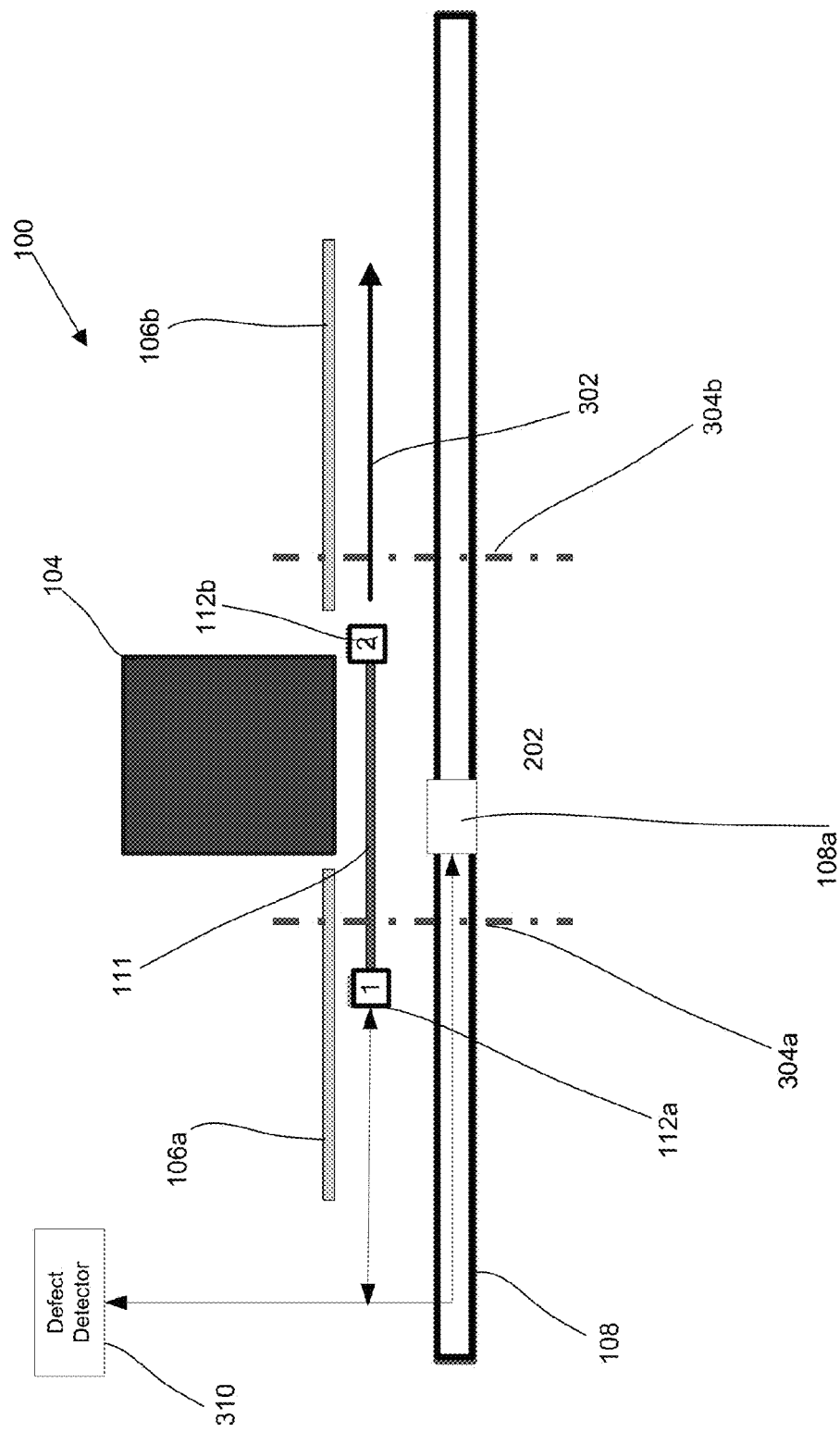
FIG. 3A illustrates a side view of encoder heads at a first position with respect to 2D grid encoders in accordance with a specific implementation of the present invention.

When multiple 2D encoder scales are used, for example, to cover different areas around the optics head, each encoder head can have positions that correspond to the base hole 104a or gap 202, as well as specific positions that transition from one 2D encoder scale to another 2D encoder scale. FIG. 3A illustrates a side view of encoder heads at a first position with respect to 2D grid encoders in accordance with a specific implementation of the present invention. For example, first encoder head 112a and second encoder head 112b can be moved in an x or y direction (e.g., in x direction 302) to be positioned under 2D grids 106a or 106b or gap 202. More specifically, first encoder head 112a can move from position 304a, which is under 2D encoder grid 106a, to gap area 104a, and then to position 304b, which is under 2D encoder grid 106b.

As different chuck encoder heads move under different 2D encoder portions, various techniques may be utilized to accurately track the position of the stage (and sample) relative to the different 2D encoder portions and attached optics head 104 while the chuck encoder heads are transitioning over a gap. In one technique, tracking may include switching between reading the position from the stage encoder scales 108 to reading the position from the 2D encoder grids 106 for defect position reporting and/or servo control for not losing the signal and position (e.g., providing feedback for stage and chuck positioning). The system 100 may also include a defect detector module 310 that is configured to receive detected position signals (e.g., such as position signals from the chuck encoder heads 112a~d and stage encoder heads 108a~b) and determine and report a position of a defect on the sample as described further below.

Figure 4:
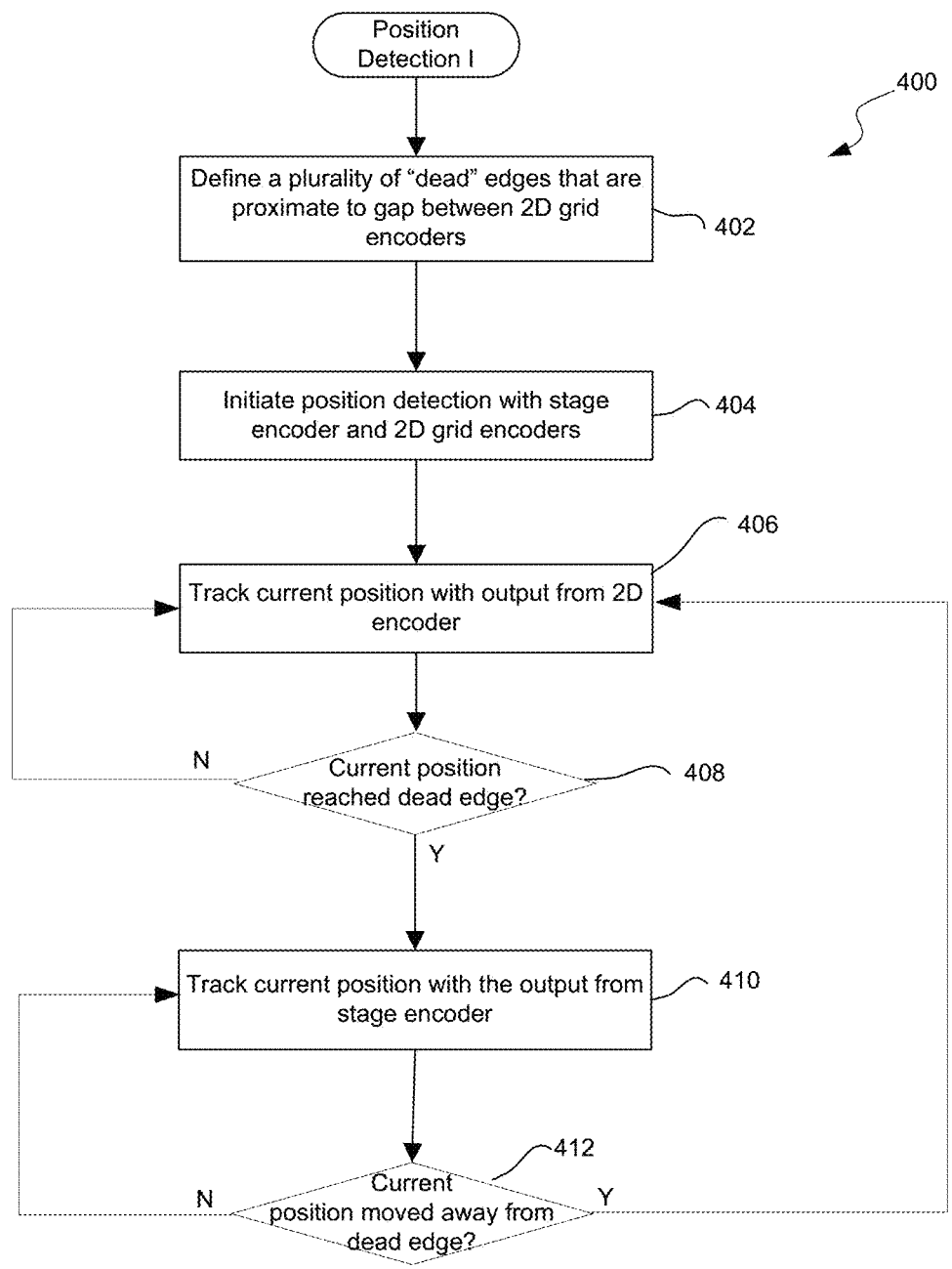
FIG. 4 is a flow chart illustrating a position detection process in accordance with a first embodiment of the present invention.

In one implementation, the 2D grid encoder is used as a master positioning system, while the stage encoder scale is used as a slave. FIG. 4 is a flow chart illustrating a position detection process in accordance with a first embodiment of the present invention. Initially, a plurality of "dead" edges that are proximate to a gap between 2D grid encoders may be defined in operation 402. In general, a dead area may be defined that corresponds to a gap (e.g., 202 of FIG. 2) that is not covered by a 2D grid encoder. The dead edges can be defined proximate to this dead area, but at positions that are still covered by a 2D grid encoder. For example, positions 304a and 304b, which are adjacent to gap 202, may be defined as dead edges.

Position detection may then be initiated with the stage encoder and the 2D grid encoders in operation 404. That is, the chuck encoder heads can detect a first encoder position from the 2D encoder scales, and the stage encoder can detect a second encoder position from the stage encoder scales. The stage encoder position may correspond to an x and y position from two linear stage encoders.

Figure 5:
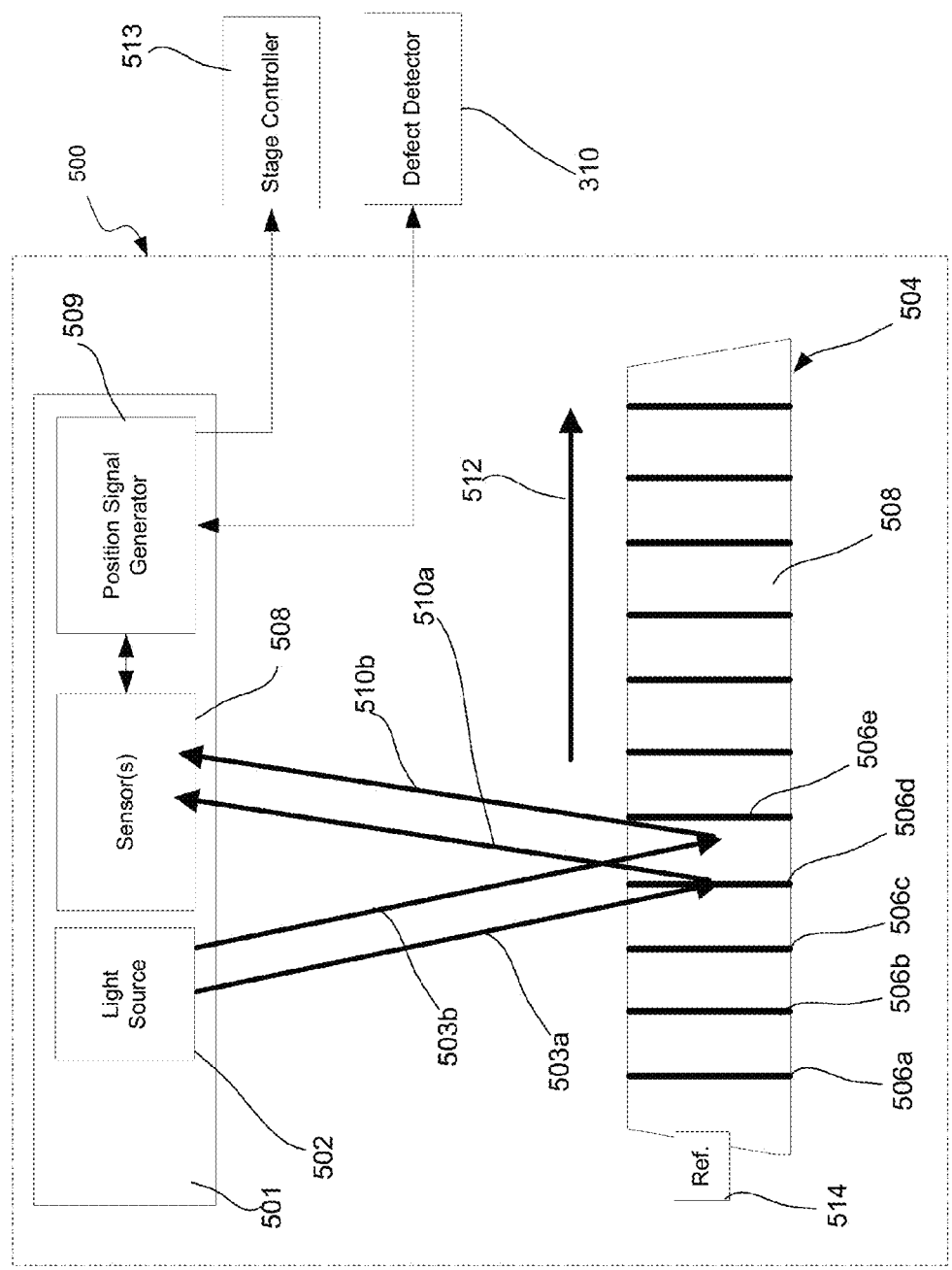
FIG. 5 is a diagrammatic representation of a reflective type linear encoder system.

When the stage's position is detected using the stage encoder scale, an encoder head utilizes reflective light detection with respect to the linear encoder scale 108. FIG. 5 is a diagrammatic representation of a reflective type linear encoder system 500. As shown, the linear encoder 500 includes read-head 501 and encoder scale 504. The read-head includes one or more light sources 502 for directing two light beams 503a and 503b towards the linear encoder scale 504. For example, an infrared LED, visible LED, miniature light-bulbs, or laser diodes may be used. Multiple light sources may be used.

The encoder scale 504 may be formed from a plurality of reflective lines (e.g., 506a~508e) over a nonreflective (e.g., transparent/absorptive) material (e.g., 508). For example reflective lines can be formed over a glass or glass-ceramic material, such as Zerodure glass available from Schott North America Inc. of Elsford, N.Y.

Light is reflected from the reflective line portions as the stage moves over the linear encoder scale 504. The reflected light beams 510a and 510b can then be sensed by one or more sensors 508, such as a photosensor. The encoder system 500 may include one or more other gratings (not shown) positioned within the path of the reflected light so as to provide a shutter effect on sensor 508.

Other types of encoders may utilize other technologies, such as magnetic, for the scale encoding and detector selection/arrangement. Magnetic linear encoders may employ active (magnetized) or passive (variable reluctance) scales and position may be sensed using sense-coils, Hall effect or magnetoresistive readheads.

Linear encoders can utilize analog or digital output signals that are produced in response to multiple light beams reflected from the encoder scale as the stage moves relative to such scale. In the illustrated embodiment, the first and second reflective beams 510a and 510b correspond to a first output channel and a second output channel, respectively. The direction of movement may be detected by use of multiple channels, such as produced from output beams 510a and 510b. In the illustrated embodiment, if the stage (and encoder head) are moving in direction 512, the reflected beam from the second channel 510b from any specific reflective line (e.g., 506d) will be received ahead of the reflected beam from the first channel from the same specific reflective line.

The encoder system may also include a position signal generator 509 for outputting one or more position signals based on the detected signals from the sensor(s) 508. In some implementations, the output from an encoder may be in the form of cosine and sine quadrature signals. These analog signals may be serve as input to an interpolation process to increase resolution of the detected scale. For instance, the interpolation process can be in the form of quadrature square waves—the distance between edges of the two channels being the resolution of the encoder. In this example, the interpolation results in 4 times the scale's pitch. The detected signal period can be further sub-divided (e.g., by an analog to digital converter) to increase the resolution of detectable positions.

Some incremental linear encoders (vs. absolute) can produce an index or reference mark pulse providing a datum position along the scale fro use at power-up or Mowing a loss of power. This index signal can identify position within one, unique period of the scale. The reference mark may comprise a single feature on the scale, an autocorrelator pattern or a chirp pattern. Distance coded reference marks (DCRM) can be placed onto the incremental scale in a unique pattern so that sensing two positions can define the encoder head's position. The reference mark or index pulse can also be processed digitally and can be a pulse, usually one to four units-of-resolution wide. As shown, the encoder system 500 may also include a reference device 514 (such as a chirp device or reference mark) for detecting a reference position for the scale positions, for example, by outputting a "home" signal or providing an optically detectable reference. Absolute 2D encoders are available from Magnescale Co. Ltd. of Osaka, Japan. If multiple absolute 2D encoder scales are positioned around the inspection head, there is no need to switch between positions detected by the stage encoder and 2D encoder at the gap since the absolute position can be read with these absolute 2D encoder scales and at least one chuck encoder head can be engaged with a 2D encoder scale. That is, there is no need to use the stage encoder, but the absolute position is still obtained from the different 2D encoder scale portions. In this example, the 2D encoder heads and scales provide an absolute position, and the 2D encoder heads and scales may be positioned so that the absolute position of the stage, chuck, and sample can be detected by at least one of the 2D encoder heads from at least one of the 2D encoder scales. Movement of the stage and/or determining and reporting defect locations on the sample may then then be based on the absolute position detected by at least one of the 2D encoder heads.

The output from the encoder system 500 may be received by stage controller 513 and defect position detection module 310. The stage controller 513 can be configured to move the stage, chuck, and sample based on encoder position signals. The defect detector can be configured to determine a defect position based on encoder position signals.

Figure 6:
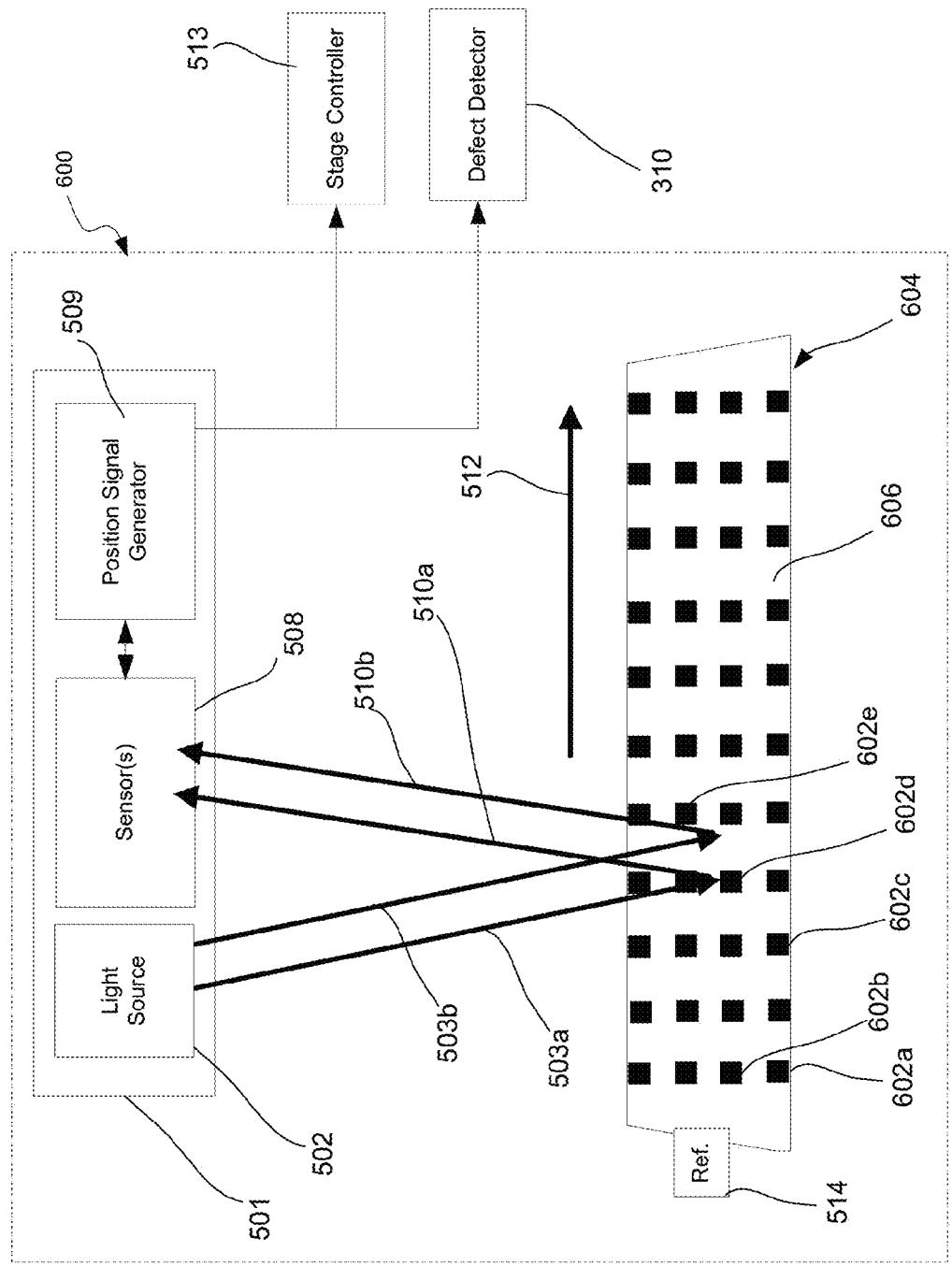
FIG. 6 illustrates a 2D grid encoder system having a 2D grid scale in accordance with a specific implementation of the present invention.

FIG. 6 illustrates a 2D grid encoder system 600 having a 2D grid scale 604 in accordance with a specific implementation of the present invention. The 2D grid encoder may have components that are similar to the linear encoder system 500 and also output position signals to stage controller 513 and defect detector 310. However, the 2D scale may be in the form a grid of reflective shapes (e.g., 602a~602e), such as dots, squares, etc., which are disposed on a non-reflective substrate 606. One supplier of 2D encoders is Magnescale Co. Ltd. as noted above. One absolute 2D encoder is described in the publication entitled "Self-compensating Absolute Laserscale: Next generation high accuracy Laserscale with unique algorithm to detect absolute position", Magnescale Co. Ltd., Oct. 20, 2014, which publication is incorporated herein by reference.

In this embodiment, the current position is tracked with the output of at least one of the 2D grid encoders 106 in operation 406. For instance, the output from the chuck heads is used as the current position to control the position for lithography or inspection, as well as provide positions for detected defects or measurements for a semiconductor sample. In the example of FIG. 3A, the current position is tracked with respect to 2D grid encoder 106a by encoder head 112a and used as input to a stage controller, e.g., which includes a servo controller mechanisms 109a. The current position can also be tracked by encoder head 112c via 2D grid encoder 106c (not shown in FIG. 3A) and used as input to a stage controller. In an alternative embodiment, the stage controller may be configured to always use output from the stage encoder as the current position (for servo control), while the defect detector uses the output from the 2D grid encoder(s) as the current position of a defect until a gap is reached.

Figure 3B:
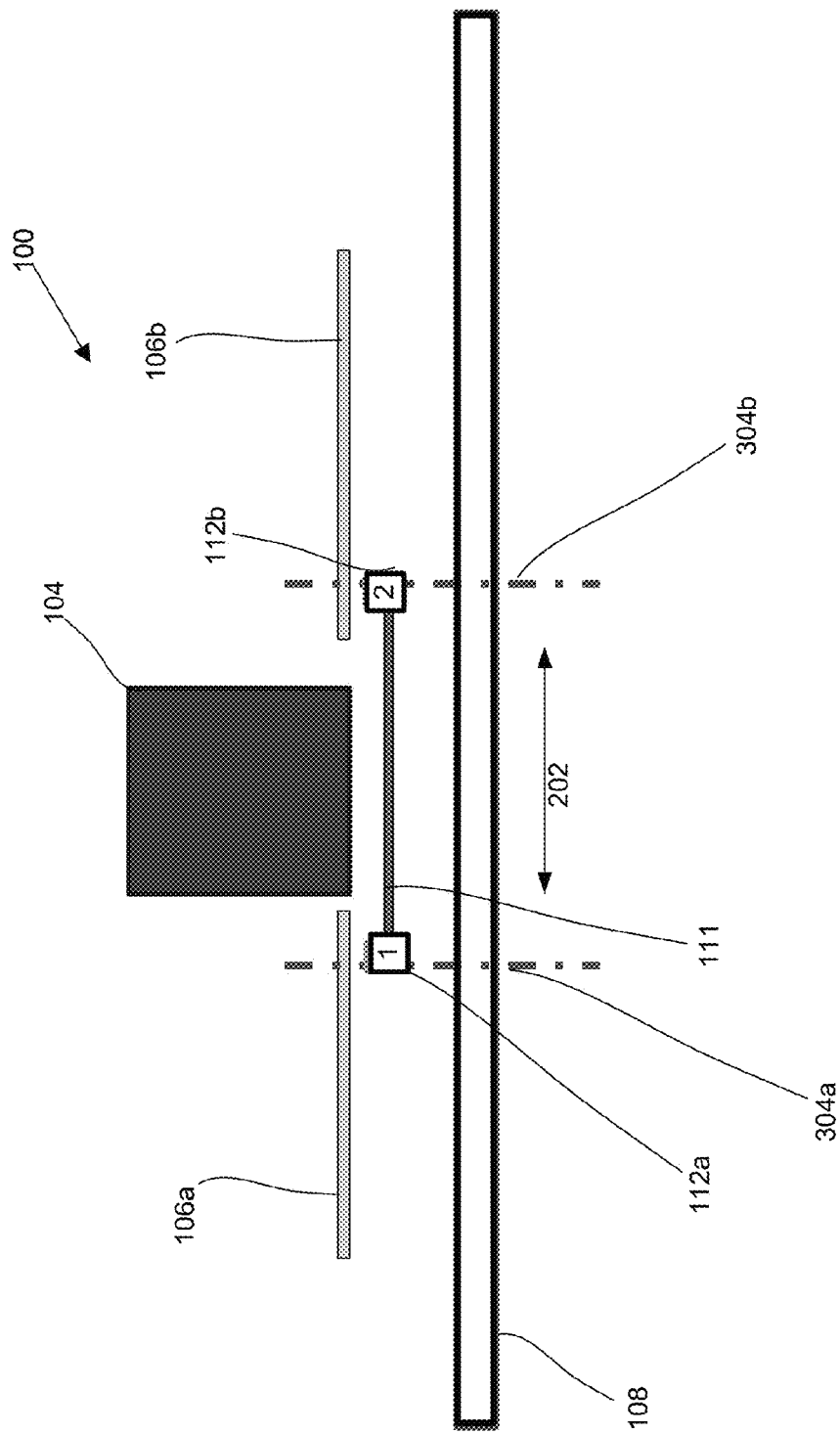
FIG. 3B illustrates a side view of encoder heads at a second position with respect to 2D grid encoders in accordance with a specific implementation of the present invention.

For each new position or for every predefined number of positions, it may be determined whether the current position has reached a defined dead edge in operation 408. For instance, it may be determined whether the current position is about to reach the gap 202 that is not covered by a 2D grid encoder. If a dead edge has not yet been reached, the current position may continue to be tracked with the 2D encoder. In the example of FIG. 3A, first encoder head 112a has not yet reached dead edge 304a. A fast DSP of an FPGA position counter can switch in real-time between the 2D encoder and the stage encoder within one encoder count of error, such as 1 nm In the example of FIG. 3B, the first encoder head 112a has reached dead edge 304a and is about to leave 2D grid encoder 106a. At this current position, the second encoder head is at the dead edge of 2D grid encoder 106b. When a dead edge is reached, the current position may then be tracked with output from the stage encoder (e.g., for servo control and/or defect position reporting) in operation 410. That is, current position tracking switches from using the output from the chuck's 2D grid encoder heads to using output from the stage encoder heads when a dead edge that precedes an area that does not include 2D grid encoders is reached. The stage encoder position may be stable for the short period of time during which the gap is being crossed by the chuck encoder heads.

In this embodiment, it is assumed that the stage is already traveling so that the chuck encoder heads are not immediately transitioning from one 2D grid to another. However, the process can also include an initial determination as to whether the chuck encoder heads are currently positioned adjacent to 2D encoders or positioned at a dead edge.

Figure 3C:
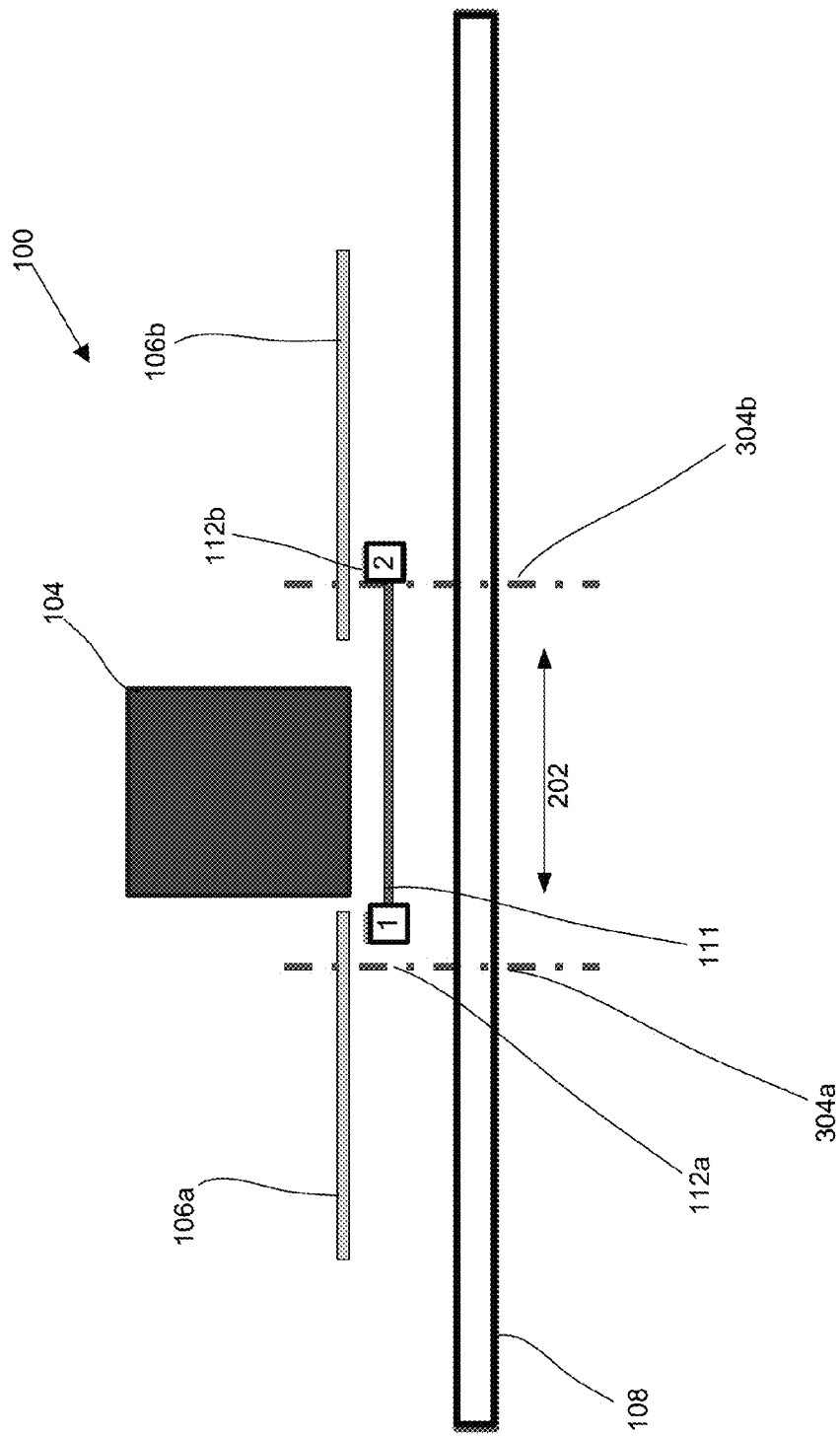
FIG. 3C illustrates a side view of encoder heads at a third position with respect to 2D grid encoders in accordance with a specific implementation of the present invention.

Referring back to FIG. 4, it may be determined if the current position has moved away from a dead edge in operation 412. In the example of FIG. 3C, the second encoder head 112b has moved away from dead edge 304c and is now in a position to read 2D grid encoder 106b. It may be determined that the current position has moved away from a dead edge by comparing the current position to an edge's known position or by expiration of a time period that coincides with the time it takes for encoder heads to transition between 2D encoder scale portions. When the current position has moved away from a dead edge (or at least one of the encoder heads is now positioned adjacent to a 2D grid encoder), the current position may be again tracked with the position output sensed from at least one of the 2D grid encoders 106 (e.g., for servo control and/or defect position reporting) in operation 406. Otherwise, the current position continues to be tracked by the stage encoder. The tracking may continue during operation of the lithography or metrology system.

Figure 7:
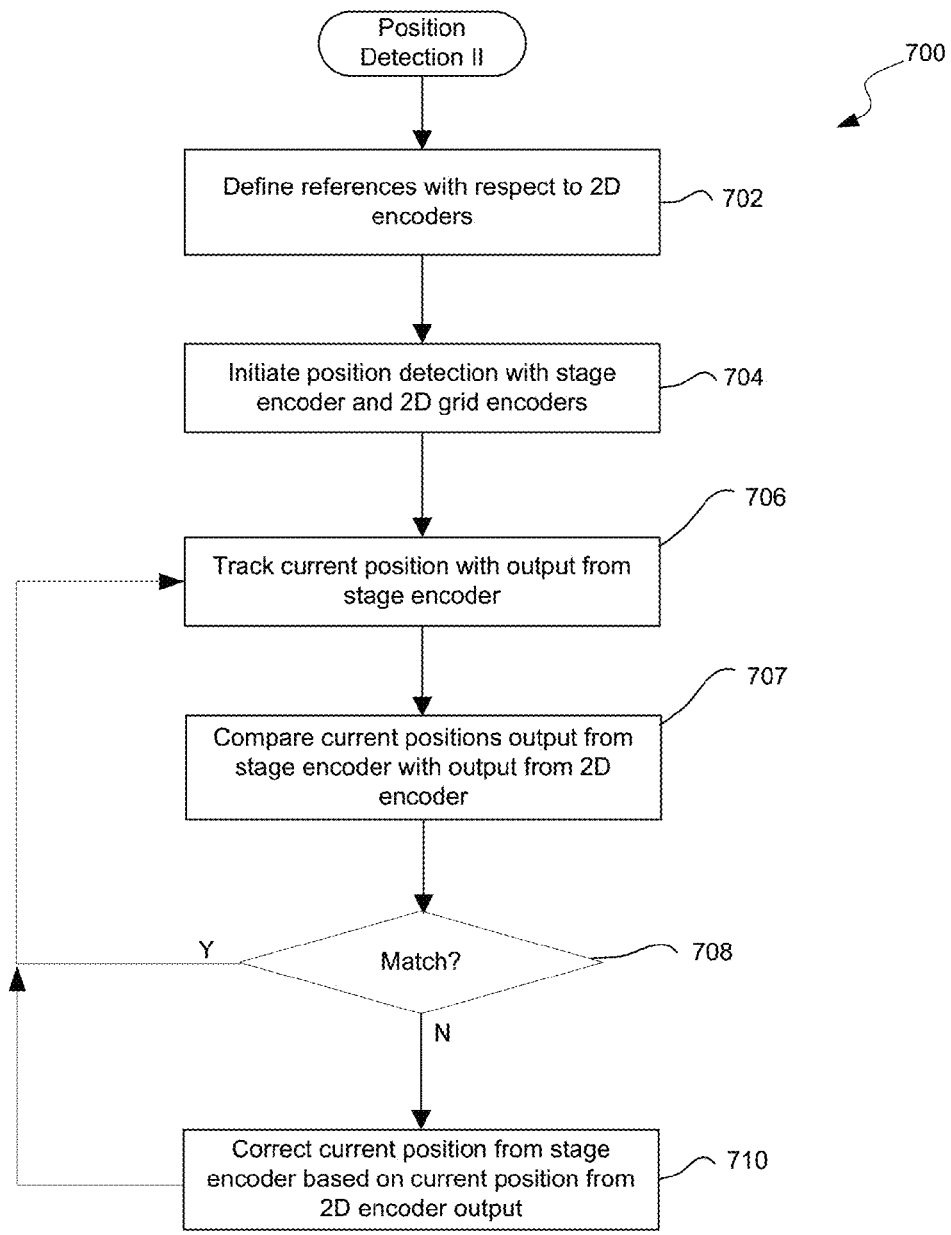
FIG. 7 is a flow chart illustrating a position detection process in accordance with a second embodiment of the present invention.

FIG. 7 is a flow chart illustrating a position detection process in accordance with a second embodiment of the present invention. References may be defined with respect to the 2D encoders in operation 702. For instance, a plurality of reference positions on the 2D encoder may be determined. The reference positions may be evenly spaced and have a distance that corresponds with a travel distance in which thermal expansion may affect the stage encoder so as to distort the detected position, depending on the travel velocity. For example, references may be spaced apart by a distance that is less than 50 micron.

Position detection may be initiated with both the stage encoder and 2D encoders in operation 704 as described above. The controlled position may then be tracked with the output from the stage encoder in operation 706. That is, the current position is determined from the output of the linear encoder 108 (e.g., for servo control and/or defect position reporting).

The current position from the stage encoder may then be compared to the current position that is output from the 2D encoder in operation 707. It may then be determined whether the current positions match in operation 708. Under certain operating conditions, the stage components may heat or heat may be dissipated so that the stage components expand or contract and affect the stage encoder's position reading. If there is a match, the current position continues to be tracked without correction. If there not a match, the current position from the stage encoder is corrected based on the 2D encoder output in operation 710. The current position continues to be tracked from the stage encoder and corrected as needed based on the 2D encoder output.

Regardless of the position detection method, the encoders may be calibrated using a reference sample. The reference sample may be a "Golden defect wafer" or reticle, for example, with structures that are accurately printed at known positions or known critical dimensions (CD). The structure positions may have been verified (e.g., relative to a sample reference) by some other technique or tool. The positions of these structures can then be measured by the lithography or inspection system having the 2D grid encoder so as to determine whether any detected positions from the 2D grid encoder and/or stage encoder require offsets so as to match the known structure positions.

System Examples:

The stage positioning and detection system described herein may be integrated into any suitable optical system. Example systems may include a photolithography system, semiconductor wafer or reticle inspection or metrology tool, etc.

Figure 8A:
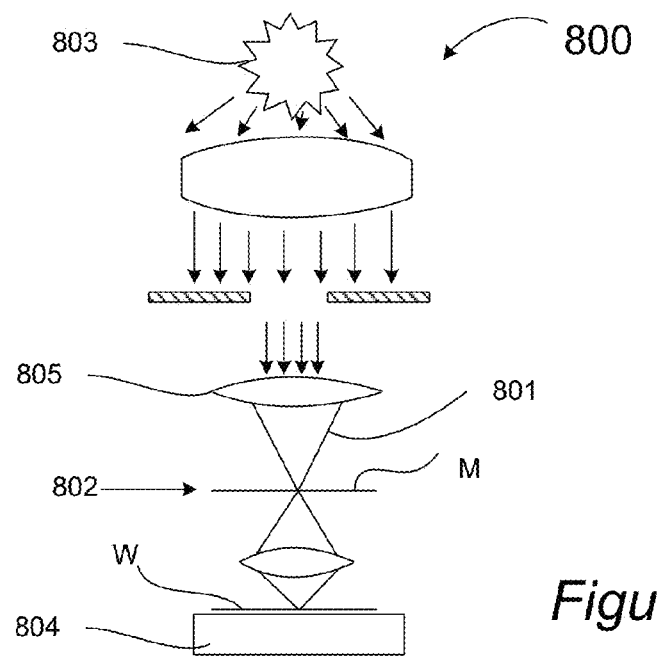
FIG. 8A is a simplified schematic representation of a lithographic system for transferring a mask pattern from a photomask onto a wafer in accordance with certain embodiments.

FIG. 8A is a simplified schematic representation of a typical lithographic system 800 that can be used to transfer a mask pattern from a photomask M onto a wafer W in accordance with certain embodiments. Examples of such systems include scanners and steppers, more specifically PAS 5500 system available from ASML in Veldhoven, Netherlands. In general, an illumination source 803 directs a light beam through an illumination lens 805 onto a photomask M located in a mask plane 802.

The illumination source 803 may take the form of a laser, broadband source, etc. The illumination lens 805 has a numeric aperture 801 at that plane 802. The value of the numerical aperture 801 impacts which defects on the photomask are lithographic significant defects and which ones are not. A portion of the beam that passes through the photomask M forms a patterned optical signal that is directed through imaging optics 810 and onto a wafer W to initiate the pattern transfer. The wafer W may be positioned on a chuck of a stage positioning mechanism 804 that includes stage position detection mechanisms as described above.

Figure 8B:
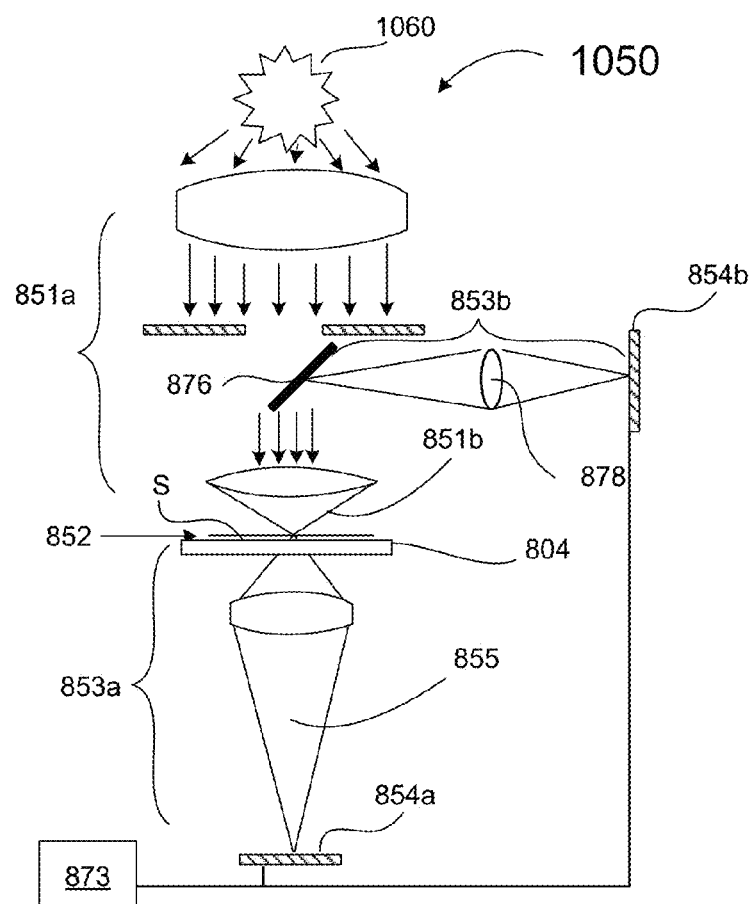
FIG. 8B provides a schematic representation of an inspection apparatus in accordance with certain embodiments.

FIG. 8B provides a schematic representation of an inspection (or metrolology) system 850 that has an illumination system 851*a* with a relative large numerical aperture 851*b* at a plane 852 in accordance with certain embodiments. The depicted inspection system 850 may include microscopic magnification optics that are designed to provide, for example, 60-200× magnification for enhanced inspection. The numerical aperture 851*b* at the plane 852 of the inspection system is often considerable greater than the numerical aperture 801 at the plane 802 of the lithography system 800, which would result in differences between test inspection images and actual printed images. Each of these optical systems (800, 850) induces different optical effects in the produced images, and such systems can implement techniques for compensating for such effects during an inspection or metrology process.

The stage movement and position detection apparatus that is described herein may be implemented on various specially configured inspection or metrology systems, such as the one schematically illustrated in FIG. 8B. The illustrated system 850 includes an illumination source 860 producing at least one light beam that is directed through illumination optics 851*a* onto a sample S, such as a photomask or wafer, in plane 852. As explained above, the inspection system 850 may have a numerical aperture 851*b* at plane 852 that may be greater than a reticle plane numerical aperture of the corresponding lithography system. The illumination optics 851 *a* may also include various lens and modules for achieving multiple beams with different characteristics. The sample S to be inspected/measured is placed on a stage mechanism 804 at the plane 852 and exposed to the source.

The transmitted image from a sample S (e.g., a mask) can be directed through a collection of optical elements 853*a*, which project the patterned image onto a sensor 854*a*. Optical elements (e.g., beam splitter 876 and detection lens 878) are arranged to direct and capture the reflected and/or scattered light from the sample S onto sensor 854*b*. Suitable sensors include charged coupled devices (CCD), CCD arrays, time delay integration (TDI) sensors, TDI sensor arrays, photomultiplier tubes (PMT), and other sensors. Certain inspection tools may include only the reflecting collection optics 853*b* (or other scattering optics) and sensor 854*b*, excluding optics 853*a* and sensor 854*a*.

The illumination optics column may be moved relative to a detector or camera/sensor by any suitable mechanism so as to detect light from various portions of the sample S. For example, a stage positioning mechanism, including position detection mechanisms, may be implemented as described above.

The signals captured by each sensor (e.g., 854*a* and/or 854*b*) can be processed by a controller system 873, such as by one or more signal processing devices, which may each include an analog-to-digital converter configured to convert analog signals from each sensor into digital signals for processing. The controller system 873 may include one or more processors coupled to input/output ports, and one or more memories via appropriate buses or other communication mechanisms. A controller system may also be implemented in a photolithography system (e.g., as described with reference to FIG. 8A) to control various components.

The controller system 873 may also include one or more input devices (e.g., a keyboard, mouse, joystick) for providing user input, such as changing focus and other inspection recipe parameters. The controller system 873 may also be connected to the stage positioning mechanism for controlling, for example, a sample position (e.g., focusing and scanning) and connected to other inspection/metrology/lithography system components for controlling other inspection parameters and configurations of such inspection/metrology/lithography system components.

The controller system 873 may be configured (e.g., with programming instructions) to provide a user interface (e.g., a computer screen) for displaying resultant intensity values, images, and other inspection/metrology/lithography results. The controller system 873 may be configured to generate initial and final z offset trajectories, analyze intensity, autofocus measurements, and/or other characteristics of reflected and/or transmitted sensed light beam. The controller system 873 may be configured (e.g., with programming instructions) to provide a user interface (e.g., on a computer screen) for displaying resultant intensity values, images, and other inspection/metrology/lithography characteristics. In certain embodiments, the controller system 873 is configured to carry out position detection techniques detailed above.

Because such information and program instructions may be implemented on a specially configured computer system, such a system includes program instructions / computer code for performing various operations described herein that can be stored on a non-transitory computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

In certain embodiments, a system for inspecting a sample includes at least one memory and at least one processor that are configured to perform techniques described herein.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. For example, the defect detection characteristic data may be obtained from a transmitted, reflected, or a combination output beam. Additionally, mechanical inspection tools, such as atomic force microscopy or a scanning probe microscopy tools may utilize the stage control and defect position detection techniques and mechanisms described above. Accordingly, the present embodiments are to be considered as illustrative and not restrictive, and the invention is not to be limited to the details given herein.

What is claimed is:

1. An apparatus for fabricating, measuring, or inspecting a semiconductor wafer, the apparatus comprising:
   a head for directing an electromagnetic beam towards a sample in the form of a semiconductor wafer or photolithography mask;
   a base having a hole through which the head is inserted;
   a movable stage having a chuck for holding the sample;
   a stage controller for controlling movement of the chuck and sample with respect to the head;
   a plurality of two dimensional (2D) encoder scales that are affixed to a surface of the base that is opposite a surface of the chuck and are statically placed with respect to the head, wherein the 2D encoder scales are arranged to form a gap around the hole of the base through which the head is inserted;
   a plurality of chuck encoder heads affixed to the chuck for detecting a position of the stage and sample relative to the head by sensing of the 2D encoder scales; and
   a stage encoder for detecting a position of the chuck and sample,
   wherein the stage controller is configured to control movement of the movable stage and chuck based on either (i) the position detected from the chuck encoder heads when such chuck encoder heads are not transitioning across the gap between the 2D encoder scales or (ii) the position detected from the stage encoder when the chuck encoder heads are transitioning across such gap.

2. The apparatus of claim 1, wherein the apparatus is in the form of a semiconductor inspection tool and further comprises a defect detector for detecting defects on the sample, wherein the defect detector is configured for:
   determining and reporting a defect position based on the position detected from the chuck encoder heads when such chuck encoder heads are not transitioning across the gap; and
   determining and reporting the defect position based on the position detected from the stage encoder when the chuck encoder heads are transitioning across the gap.

3. The apparatus of claim 1, wherein the 2D encoder scales comprise two 2D encoder scales arranged around the hole of the base.

4. The apparatus of claim 1, wherein the 2D encoder scales comprise four 2D encoder scales arranged around the hole of the base.

5. The apparatus of claim 1, wherein the stage encoder is in the form of two linear stage encoders from which an X,Y position is detected, wherein the two linear stage encoders each include an encoder head that is integrated with the stage controller and an encoder scale that is coupled with a stage frame that is stationary with respect to the movable stage.

6. The apparatus of claim 1, wherein the apparatus is in the form of a photolithography tool.

7. The apparatus of claim 1, wherein the apparatus is in the form of a semiconductor inspection or metrology tool.

8. The apparatus of claim 1, wherein the head is an optical column for directing one or more optical beams towards the sample.

9. The apparatus of claim 1, wherein the head is an electron beam column for directing one or more electron beam towards the sample.

10. An apparatus for detecting defects on a semiconductor wafer, the apparatus comprising:
    an inspection head for inspecting a sample in the form of a semiconductor wafer or photolithography mask;
    a base having a hole through which the head is inserted;
    a movable stage having a chuck for holding the sample;
    a stage controller for controlling movement of the chuck and sample with respect to the head;
    a plurality of two dimensional (2D) encoder scales that are affixed to a surface of the base that is opposite a surface of the chuck, wherein the 2D encoder scales are arranged to form a gap around the hole of the base through which the head is inserted;
    a plurality of chuck encoder heads affixed to the chuck for detecting a position of the stage and sample relative to the head by sensing the 2D encoder scales; and
    a stage encoder for detecting a position of the chuck and sample, wherein the stage controller is configured to control movement of the movable stage and chuck based on the position detected from the stage encoder; and a defect detector for detecting defects on the sample, wherein the defect detector is further configured for determining and reporting defect positions based on the position detected from the chuck encoder heads.

11. The apparatus of claim 10, wherein the defect detector is further configured for:

determining and reporting defect positions based on the position detected from the chuck encoder heads only when such chuck encoder heads are not transitioning across the gap; and determining and reporting defect positions based on the position detected from the stage encoder when the chuck encoder heads are transitioning across the gap.

12. The apparatus of claim 11, wherein the head is an optical column for directing one or more optical beams towards the sample.

13. The apparatus of claim 11, wherein the head is an electron beam column for directing one or more electron beam towards the sample.

14. A method comprising:

receiving a semiconductor sample on a chuck of a stage that is movable with respect to a stage frame;

moving the stage, chuck, and sample under a head for directing an electromagnetic beam towards the sample, wherein a plurality of two-dimensional (2D) encoder heads are coupled with the chuck, wherein a plurality of 2D encoder scales are coupled with a base through which the head is inserted, wherein a stage encoder is positioned on the stage frame;

controlling movement of the stage, chuck, and sample based on a positon detected by at least one of the 2D encoder heads sensing at least one of the plurality of 2D encoder scales until a predefined position that is within a gap not covered by the 2D encoder scales is reached by the at least one 2D encoder heads; and switching to controlling movement of the stage, chuck, and sample based on a position detected by the stage encoder when the predefined position that is within the gap not covered by the 2D encoder scales is reached.

15. The method of claim 14, further comprising:

inspecting the sample for defects using the head, wherein the head is in the form of an inspection head;

determining and reporting defect locations based on a positon detected by at least one of the 2D encoder heads until the predefined position that is within a gap not covered by the 2D encoder scales is reached; and switching to determining and reporting defect locations based on a position detected by the stage encoder when the predefined position that is within the gap is reached.

16. The method of claim 15, further comprising:

switching back the controlling of movement and defect determination and reporting from being based on a positon detected by the stage encoder to at least one of the 2D encoder heads when a second predefined position that is not within the gap is reached.

17. A method comprising:

receiving a semiconductor sample on a chuck of a stage that is movable with respect to a stage frame;

moving the stage, chuck, and sample under an inspection head for inspecting the sample, wherein a plurality of two-dimensional (2D) encoder heads are coupled with the chuck, wherein a plurality of 2D encoder scales are coupled with a base through which the inspection head is inserted, wherein a stage encoder is positioned on the stage frame;

controlling movement of the stage, chuck, and sample based on a positon detected by the stage encoder;

determining and reporting defect locations based on a positon detected by at least one of the 2D encoder heads sensing at least one of the 2D encoder scales until a predefined position that is within a gap not covered by the 2D encoder scales is reached; and switching to determining and reporting defect locations based on a position detected by the stage encoder when the predefined position that is within the gap and not covered by the 2D encoder scales is reached.

18. The method of claim 17, further comprising:

switching back the defect determination and reporting from being based on a positon detected by the stage encoder to at least one of the 2D encoder heads when a second predefined position that is not within the gap is reached.

19. A method comprising:

receiving a semiconductor sample on a chuck of a stage that is movable with respect to a stage frame;

moving the stage, chuck, and sample under an inspection head for inspecting the sample, wherein a plurality of two-dimensional (2D) encoder heads are coupled with the chuck, wherein a plurality of 2D encoder scales are coupled with a base through which the inspection head is inserted, wherein the 2D encoder heads and scales provide an absolute position and wherein the 2D encoder heads and scales are positioned so that the absolute positon of the stage, chuck, and sample can be detected by at least one of the 2D encoder heads by sensing at least one of the 2D encoder scales;

controlling movement of the stage, chuck, and sample based on the absolute positon detected by at least one of the 2D encoder heads; and determining and reporting defect locations on the sample based on the absolute positon detected by at least one of the 2D encoder heads.

* * * * *